(12) United States Patent
Kirichenko

(10) Patent No.: US 7,728,748 B1
(45) Date of Patent: Jun. 1, 2010

(54) SUPERCONDUCTING ANALOG-TO-DIGITAL CONVERTER

(75) Inventor: Dmitri Kirichenko, Yorktown Heights, NY (US)

(73) Assignee: HYPRES, Inc., Elmsford, NY (US)

( * ) Notice: Subject to any disclaimer, the term of this patent is extended or adjusted under 35 U.S.C. 154(b) by 17 days.

(21) Appl. No.: 12/334,428

(22) Filed: Dec. 12, 2008

(51) Int. Cl.
*H03M 1/00* (2006.01)

(52) U.S. Cl. .................. 341/133; 341/143; 341/155

(58) Field of Classification Search ............... 341/143, 341/155, 133; 333/100
See application file for complete search history.

(56) References Cited

U.S. PATENT DOCUMENTS

| | | | |
|---|---|---|---|
| 5,341,136 A | 8/1994 | Przybysz | 341/133 |
| 5,351,049 A | 9/1994 | Lee | 341/133 |
| 6,157,329 A | 12/2000 | Lee | 341/133 |
| 7,038,604 B2 | 5/2006 | Hirano | 341/133 |

OTHER PUBLICATIONS

U.S. Appl. No. 11/955,666, filed Dec. 13, 2007, Kirichenko.
U.S. Appl. No. 12/212,605, filed Sep. 17, 2008, Kirichenko.
"Superconductor Analog-to-Digital Converters" O. Mukhanov, et al., Proc. IEEE, vol. 92, pp. 1564-1584 (2004).
Q. P. Herr "Inductive Isolation in Stacked SQUID Amplifiers" IEEE Transactions on Applied Superconductivity, vol. 17, pp. 565-568, (2007).
"High Performance, All Digital RF Receiver Tested at 7.5 GigaHertz" Wong, Jack;Kirichenko, Dmitri; et al. Military Communications Conference, 2007. MILCOM 2007. IEEE, Oct. 29-31, 2007 pp. 1-5, Digital Object Identifier 10.1109/MILCOM.2007.4455052.

*Primary Examiner*—Jean B Jeanglaude
(74) *Attorney, Agent, or Firm*—George Sai-Halasz

(57) ABSTRACT

A superconducting bandpass sigma-delta Analog-to-Digital Converter (ADC) is disclosed. The ADC is characterized as being an $N^{th}$-order, having N resonators, with N being at least 2. The ADC also may have N−1 amplifiers, where the amplifiers directionally couple sequential pairs of the resonators. The ADC further includes a Josephson Junction (JJ) comparator. All N resonators connect in parallel to the JJ comparator, and the JJ comparator is providing an implicit feedback for all N resonators. A method for implementing the sigma-delta ADC without any explicit feedback loops is also disclosed.

15 Claims, 4 Drawing Sheets

US 7,728,748 B1

SUPERCONDUCTING ANALOG-TO-DIGITAL CONVERTER

FIELD OF THE INVENTION

The present invention relates to superconducting electronics. In particular, it relates to Analog-to-Digital Converters.

BACKGROUND OF THE INVENTION

Superconducting analog-to-digital (ADC) converters are based on the ultra fast switching times of Josephson junction (JJ) comparators. This permits fast sampling rates of tens of gigahertz, leading to some of the fastest circuits in any electronic technology, for both Nyquist-rate ADCs and oversampling (sigma-delta and delta type) ADCs.

One well-known class of analog-to-digital converters is based on oversampling, in which a single-bit quantizer with feedback is used to generate a fast bit sequence that can accurately represent an analog input signal in the band of interest. Superconducting circuits based on Josephson junctions, in configurations known as rapid single-flux-quantum (RSFQ) logic, can switch on the picosecond timescale, leading to high sampling rates.

Sigma-delta and delta type ADCs have already been reported in superconducting electronics. In some of these ADCs an explicit feedback loop was avoided making use of a special feature of Josephson circuits, known as implicit feedback. However, implicit feedback hitherto was limited to only a single stage of oversampled ADCs.

SUMMARY OF THE INVENTION

A superconducting $N^{th}$-order bandpass sigma-delta Analog-to-Digital Converter (ADC) is disclosed, which has N resonators with N being at least 2. The ADC also may have N−1 amplifiers, where the amplifiers directionally couple sequential pairs of the resonators. The ADC further includes a Josephson Junction (JJ) comparator. All N resonators connect in parallel to the JJ comparator, and the JJ comparator is providing implicit feedback for all N resonators.

A method for converting an electromagnetic analog signal into a digital signal is disclosed. The method implements an $N^{th}$-order bandpass sigma-delta ADC, which implementation includes the following operations. Applying N resonators, and selecting N to be at least 2. Using amplifiers to directionally couple sequential pairs of the resonators. Connecting all N resonators in parallel to a JJ comparator, and receiving implicit feedback in all N resonators from the JJ comparator.

BRIEF DESCRIPTION OF THE DRAWINGS

These and other features of the present invention will become apparent from the accompanying detailed description and drawings, wherein.

DETAILED DESCRIPTION OF THE INVENTION

It is understood that sigma-delta (ΣΔ) analog-to-digital converters (ADC), also known as ΣΔ modulators, or delta-sigma (ΣΔ) modulators/ADCs, are well known in the electronic arts. Basic concepts of superconductor ADCs have been discussed already, for instance by O. A. Mukhanov et al. in "Superconductor Analog-to-Digital Converters", Proc. IEEE, Vol. 92, pp. 1564-1584 (2004), incorporated herein by reference. A multistage bandpass ΣΔ ADC in fully superconducting technology has recently been disclosed in U.S. patent application Ser. No. 11/955,666 by D. Kirichenko, filed Dec. 13, 2007, incorporated herein by reference, and also reported at the Military Communications Conference, 2007. MILCOM 2007. IEEE, 29-31 Oct. 2007, Page(s):1-5, Digital Object Identifier 10.1109/MILCOM.2007.4455052, by D. Kirichenko et al.

Due to the quantum nature of a Josephson junction comparator (JJ), when the JJ is producing an output single-flux-quantum (SFQ) pulse, simultaneously a backwards pulse is emitted, as well. This effect has various uses in ADCs. For instance, it allowed for a multi level quantizer: U.S. patent application Ser. No. 12/212,605 by D. Kirichenko, filed Sep. 17, 2008, incorporated herein by reference. The same effect was also instrumental in using implicit feedback for a single stage ΣΔ ADC by Lee et al. U.S. Pat. No. 6,157,329, incorporated herein by reference, and for the first stage of a multistage ΣΔ ADC in the aforementioned U.S. patent application Ser. No. 11/955,666 by D. Kirichenko. Embodiments of the present invention exploit the quantum nature of the JJ comparator for using implicit feedback for all stages of multistage bandpass ADCs.

The embodiments of the present disclosure are implemented in the general framework of superconductor RSFQ technology. FIG. 1A shows a block diagram of a superconducting $N^{th}$-order bandpass sigma—delta ADC 100 according to an embodiment of the present invention. The block diagram of the figure explicitly shows 3 stages of the ΣΔ ADC, and by obvious symmetry it is extended to indicate N stages. Being a multi-order ADC, by definition, N is at least 2. The terms "resonators" and "stages" are being used as equivalents for the present purposes, since it is known in the art that for multi-order bandpass ADC-s the number of resonators is defined as the number of stages, and as the order of the ADC.

Figure 1:
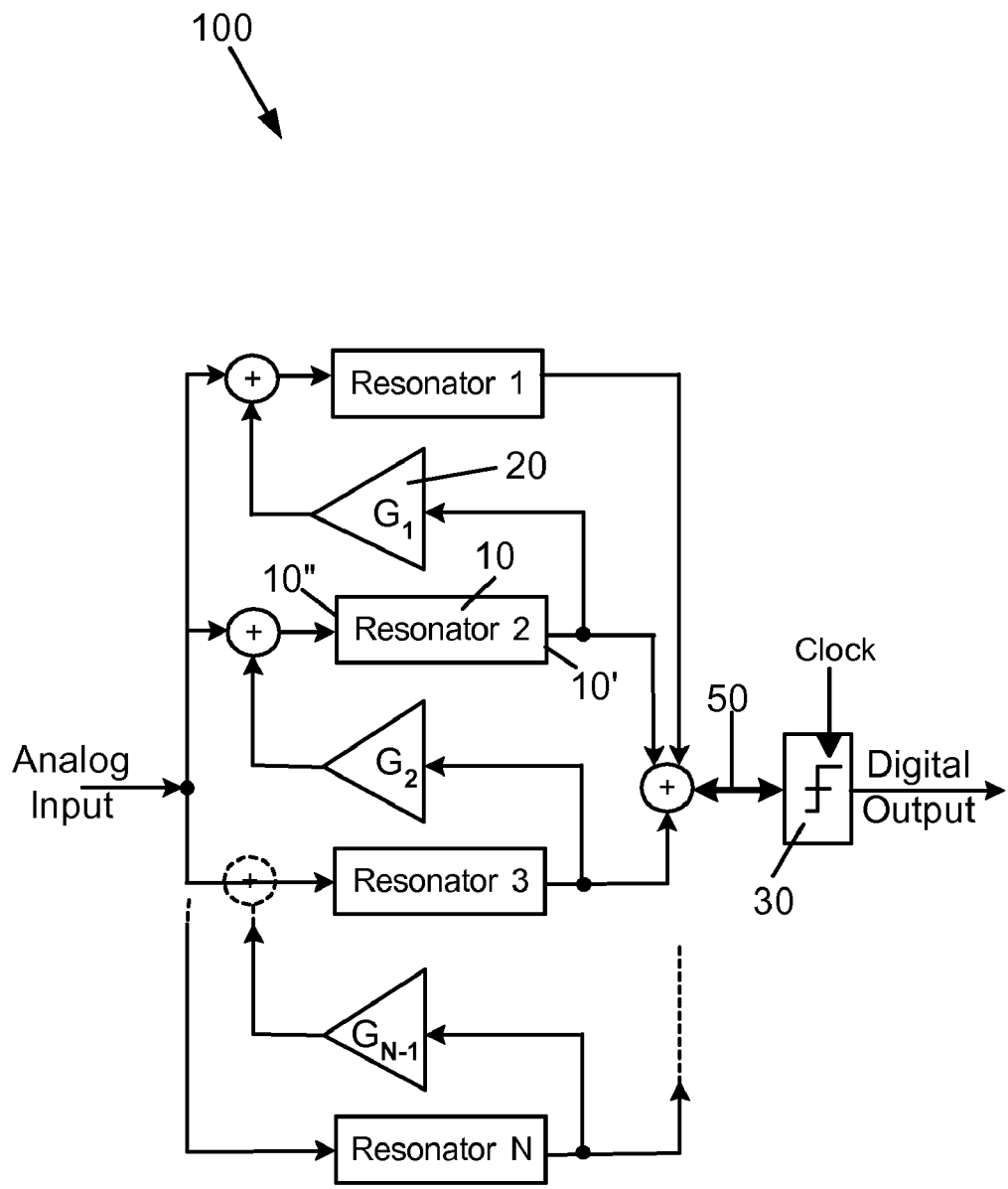
FIG. 1 shows a block diagram of a superconducting $N^{th}$-order bandpass sigma—delta ADC according to an embodiment of the present invention.

Since in FIG. 1 there are multiple resonators and amplifiers shown in repetitive positions, for simplicity, each type of element is marked only once with an indicator number: resonators 10, amplifiers 20. The N resonators 10 may be directionally coupled in sequential pairs by N−1 amplifiers 20. This means that between any two resonators 10 there may be an amplifier 20 directed from the higher order resonator toward the lower order resonator. For instance, amplifier 2 is placed between resonator 3 and resonator 2, such that it receives its input from the higher order resonator, resonator 3 in our example, and the amplifier output enters the lower order resonator, resonator 2 in our example. Apart of amplification, the role of the amplifiers may be to electrically decouple the resonators from one another. This decoupling, however may not be symmetrical, typically the higher order resonator is isolated from the influence of the lower order resonator; hence the use of the wording that the amplifiers 20 "directionally couple" sequential pairs of resonators 10.

The analog input signal, typically, but not exclusively, may be in the 100 MHz to 100 GHz range. FIG. 1 shows a representative embodiment where the analog signal is coupled in parallel to all N resonators 10. However, in general, it may not be necessary to couple the analog signal to all N resonators. Depending on a particular detail, or optimization, for instance, in regard to speed, or accuracy, one may couple the analog input signal only to one, or to a number less than N, of the resonators 10.

Although a resonator is strictly a passive device without a definite input and output port, one can functionally define input sides 10" and output sides 10'. In embodiments of the present invention the input side 10" is defined where the analog input signal is received, and the output side is defined toward the JJ comparator 30. The amplifiers 20 receive their input from the output side 10' of the resonators and feed their output to the input side 10" of the resonators 10. The output side 10' of the resonator first in order, resonator 1, is connected only to the JJ comparator 30 without entering an amplifier 20. There are no lower order resonators from which resonator 1 would have to be isolated.

The digital output of the ADC is produced by the clocked JJ comparator 30. Such JJ comparators are known in the art. The JJ comparator provides an implicit feedback 50 for all N of the resonators. The $\Sigma\Delta$ ADC of the embodiments of the present invention has no explicit feedback loop from the comparator to the resonators of the N stages.

Avoiding explicit feedback loops adds flexibility to the ADC design. In an ADC with explicit feedback loops it is highly desirable for the signal frequency and the sampling frequency to be in certain specific ratios, with the sampling frequency 4 times the signal frequency being about optimal. The embodiments of the $\Sigma\Delta$ ADC of the present disclosure, relying only on implicit feedback loops, have no such requirement; the sampling and the signal frequencies are not tied to one another.

An $N^{th}$-order, with N being at least 2, bandpass $\Sigma\Delta$ ADC, without any explicit feedback loop, wholly relying on the implicit feedback due to the quantum nature of the JJ, has not been previously contemplated in the art.

For better understanding the operation of the embodiment of the present invention, the following circuit expressions may be shown to hold. If for a $2^{nd}$ order ADC the transfer functions of the individual resonators are $H_1(s)$ and $H_2(s)$ respectively, and $G_1$ is the gain of the single amplifier, the loop filter transfer function is: $H(s)=H_1(s)+H_2(s)+G_1H_1(s)H_2(s)$; with "s", as known in the art, being the complex frequency. This scheme may be extended to $3^d$ order. If the transfer functions of the individual resonators are $H_1(s)$, $H_2(s)$ and $H_3(s)$ respectively, and the gains in the two amplifiers are $G_i$ and $G_2$, the loop filter transfer function is: $H(s)=H_1(s)+H_2(s)+H_3(s)+G_1H_1(s)H_2(s)+G_2H_2(s)H_3(s)+G_1G_2H_1(s)$ $H_2(s)$ $H_3(s)$. The symmetry of the above expression shows how to extend the loop filter transfer function to the $N^{th}$ order.

An ADC has many uses in various equipments. For instance, $\Sigma\Delta$ ADC-s are extensively used in digital radio frequency receivers.

Figure 2:
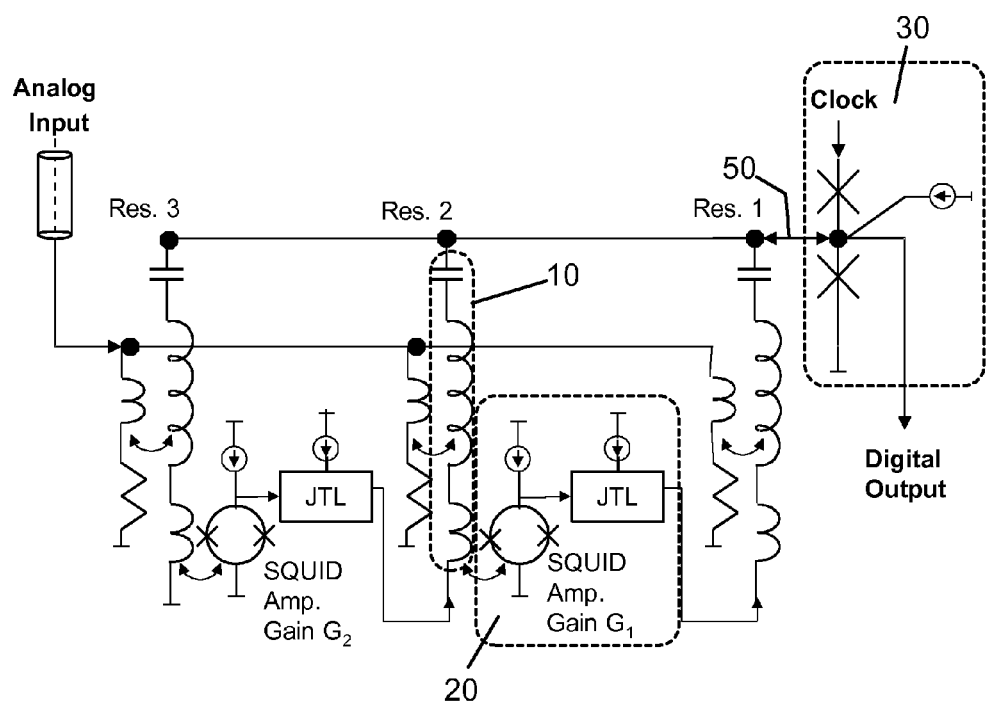
FIG. 2 shows a schematic diagram of a superconducting $3^d$-order bandpass sigma—delta ADC according to an embodiment of the present invention.

FIG. 2 shows a schematic diagram of a superconducting $3^d$-order bandpass $\Sigma\Delta$ ADC according to an embodiment of the present invention. This figure is essentially an extension of the block diagram of FIG. 1, showing actual circuit elements for a representative embodiment of the invention. The depiction of circuit elements in all the figures use conventional symbols, known in the art. Indicator numbers, just as in FIG. 1, are used only once for multiple actuals of the same elements. The dotted lines circle groups of circuit elements which form the corresponding blocks of FIG. 1.

The elements making up the amplifiers 20 are shown for typical embodiments of the invention. The amplifiers 20 contain superconducting quantum interference devices (SQUIDs) that feed into Josephson transmission lines (JTLs). The SQUID inductively couples to the higher order resonator, and the JTL directly connects to the lower order resonator. As accepted in the art, in this disclosure, as well, the meaning of "direct correction" is that of being connected by a wire. It has already been disclosed, see U.S. patent application Ser. No. 11/955,666 by D. Kirichenko, filed Dec. 13, 2007, that the SQUID/JTL combination provides amplification, and isolation between the resonators 10.

Figure 3:
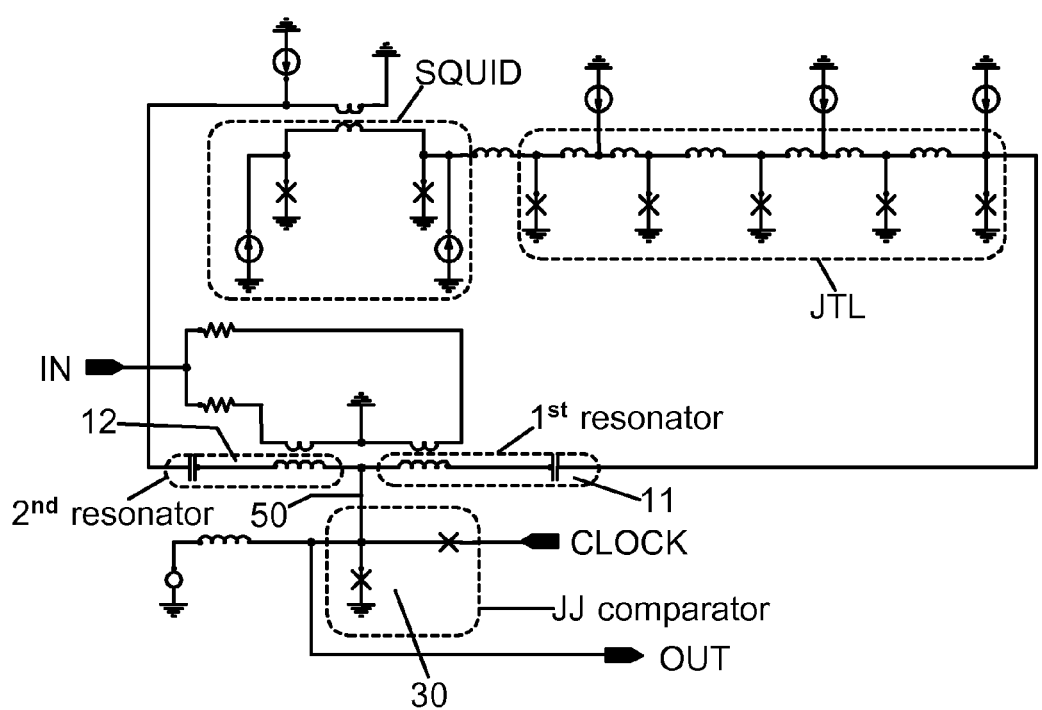
FIG. 3 shows a circuit diagram of a superconducting $2^{nd}$-order bandpass sigma—delta ADC according to an embodiment of the present invention.

FIG. 3 shows a circuit diagram of a superconducting $2^{nd}$-order bandpass $\Sigma\Delta$ ADC according to an embodiment of the present invention. Being second order, there are two resonators, a first 11, and a second 12. Again, circuit elements making up specific blocks are encircled with dotted lines. The SQUID and the JTL in combination make up the amplifier directed from the second resonator 12 to the first resonator 11. The JJ comparator 30 receives input 50 from both the first 11 and second 12 resonators, and on the same path 50, the JJ comparator provides the implicit feedback. Such $2^{nd}$-order ADCs may be the ones most commonly used in applications. The circuit diagram of FIG. 3 may serve as a basis for actual superconductor physical circuit layouts, possibly in thin film technology. The circuit may also serve as basis for numerical simulations.

FIG. 3 shows a representative embodiment where the analog signal is coupled in parallel to both the first 11 and second 12 resonators. However, in general, it may not be necessary to couple the analog signal to both resonators. Depending on a particular detail, or optimization, for instance, in regard to speed, or accuracy, one may couple the analog input signal only to one of the two resonators.

Figure 4A:
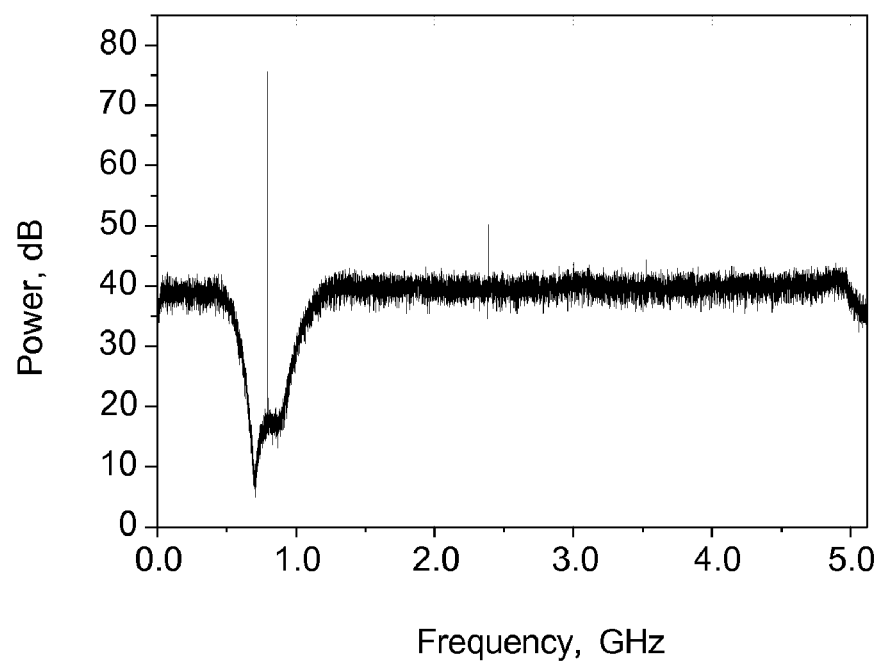
FIG. 4A shows a measured output power spectrum of a superconducting $2^{nd}$-order bandpass sigma—delta ADC according to an embodiment of the present invention.

FIG. 4A shows a measured output power spectrum of a superconducting $2^{nd}$ order bandpass $\Sigma\Delta$ ADC according to an embodiment of the present invention. The resonators are tuned to 710 MHz and 880 MHz, and the clock frequency for the JJ comparator is set to be 10.24 GHz. The noise reduction at the two resonator frequency bands clearly shows up, as well as the input signal at 796 MHz. The signal to noise ratio (SNR) of the spectrum is 31.6 dB, or 4.96 effective number of bits (ENOB) in a 660 to 915 MHz band.

Figure 4B:
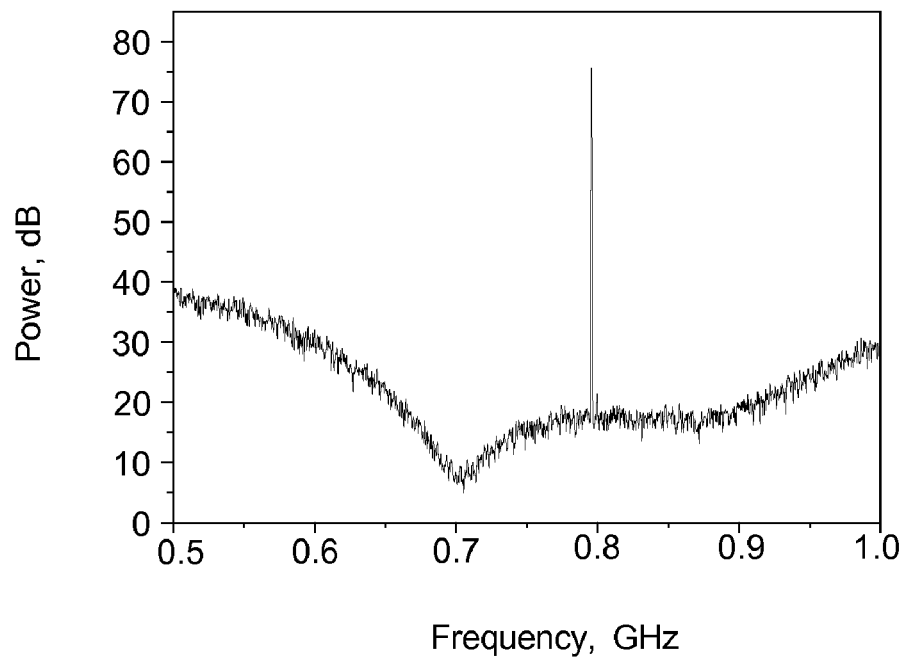
FIG. 4B shows a detailed view of a portion of the measured output power spectrum of a superconducting $2^{nd}$-order bandpass sigma—delta ADC according to an embodiment of the present invention.

FIG. 4B shows a more detailed view of a portion of the measured output power spectrum of FIG. 4A, namely in the 500 to 1000 MHz band of interest. These experimental results give confirmation on the operation of a multiple order $\Sigma\Delta$ ADC without explicit feedback loops, relying solely on implicit feedback.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art. The scope of the invention is defined by the appended claims.

I claim:

1. A superconducting Analog-to-Digital Converter (ADC), comprising:
   N resonators, with N being at least 2;
   a Josephson Junction (JJ) comparator, wherein all N said resonators connect in parallel to said JJ comparator, and wherein said JJ comparator is providing an implicit feedback for all N said resonators; and
   wherein said ADC is characterized as being an $N^{th}$-order bandpass sigma-delta ADC.

2. The superconducting ADC of claim 1, further comprising N−1 amplifiers, wherein said amplifiers directionally couple sequential pairs of said resonators.

3. The superconducting ADC of claim 2, wherein each one of said amplifiers comprises a superconducting quantum interference device (SQUID) feeding into a Josephson transmission line (JTL), and wherein said SQUID is inductively coupled to said resonators and said JTL is directly connected to said resonators.

4. The superconducting ADC of claim 1, wherein an analog input signal is coupled in parallel to all N said resonators.

5. A digital radio frequency receiver, comprising:
   an Analog-to-Digital Converter (ADC), wherein said ADC is characterized as being an $N^{th}$-order bandpass sigma-delta ADC, wherein said ADC further comprises:
   N resonators, with N being at least 2; and
   a Josephson Junction (JJ) comparator, wherein all N said resonators connect in parallel to said JJ comparator, and wherein said JJ comparator is providing an implicit feedback for all N said resonators.

6. The digital radio frequency receiver of claim 5, wherein said ADC further comprises N−1 amplifiers, wherein said amplifiers directionally couple sequential pairs of said resonators.

7. The digital radio frequency receiver of claim 6, wherein each one of said amplifiers comprises a superconducting quantum interference device (SQUID) feeding into a Josephson transmission line (JTL), and wherein said SQUID is inductively coupled to said resonators and said JTL is directly connected to said resonators.

8. The digital radio frequency receiver of claim 5, wherein an analog input signal is coupled in parallel to all N said resonators.

9. A 2-d order superconducting Analog-to-Digital Converter (ADC), comprising:
   a first resonator and a second resonator;
   a Josephson Junction (JJ) comparator, wherein both said first and second resonators connect in parallel to said JJ comparator, and wherein said JJ comparator is providing an implicit feedback for both said first and second resonators; and
   wherein said ADC is characterized as being a bandpass sigma-delta ADC.

10. The 2-d order superconducting ADC of claim 9, further comprising a superconducting quantum interference device (SQUID) and a Josephson transmission line (JTL), wherein said SQUID is inductively coupled to said second resonator, and wherein said JTL directly connects said SQUID to said first resonator.

11. The 2-d order superconducting ADC of claim 9, wherein an analog signal is being inductively received in parallel by both said first and second resonators.

12. A method for converting an electromagnetic analog signal into a digital signal, said method comprising:
   implementing an $N^{th}$-order bandpass sigma-delta Analog-to-Digital Converter (ADC), in said ADC:
   applying N resonators, wherein selecting N to be at least 2; and
   connecting all N said resonators in parallel to a Josephson Junction (JJ) comparator, and receiving an implicit feedback in all N said resonators from said JJ comparator.

13. The method of claim 12, wherein said method further comprises using amplifiers to directionally couple sequential pairs of said resonators.

14. The method of claim 13, wherein said method further comprises selecting said amplifiers to be superconducting quantum interference devices (SQUID) feeding into Josephson transmission lines (JTL).

15. The method of claim 12, wherein said method further comprises receiving said analog signal in parallel in all N said resonators.

* * * * *